US012106793B2

(12) United States Patent
Sethi et al.

(10) Patent No.: US 12,106,793 B2
(45) Date of Patent: Oct. 1, 2024

(54) BATCHING AWARE TECHNIQUES FOR REFRESHING MEMORY DEVICES

(71) Applicant: QUALCOMM Incorporated, San Diego, CA (US)

(72) Inventors: Saurabh Sethi, Mohali (IN); Madhukar Reddy N, Hyderabad (IN); Vasantha Kumar Bandur Puttappa, Bangalore (IN); Amulya Srinivasan Margasahayam, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 174 days.

(21) Appl. No.: 18/081,442

(22) Filed: Dec. 14, 2022

(65) Prior Publication Data

US 2024/0203476 A1 Jun. 20, 2024

(51) Int. Cl.
*G11C 11/40* (2006.01)
*G11C 11/406* (2006.01)
*G11C 11/4093* (2006.01)

(52) U.S. Cl.
CPC .. *G11C 11/40618* (2013.01); *G11C 11/40615* (2013.01); *G11C 11/4093* (2013.01)

(58) Field of Classification Search
CPC ................................................ G11C 11/40626
See application file for complete search history.

(56) References Cited

U.S. PATENT DOCUMENTS

2019/0026028 A1\* 1/2019 Chun ................ G11C 11/40626
2022/0254408 A1 8/2022 Wigton et al.

OTHER PUBLICATIONS

Chang K.K., "Understanding and Improving the Latency of Dram-based Memory Systems", arXiv:1712.08304V1, Cornell University Library, 201 Olin Library Cornell University Ithaca, NY A 14853, Dec. 22, 2017, pp. 232, XP080847876, 5.2, figures 5.4-5.7.
International Search Report and Written Opinion—PCT/US2023/078388—ISA/EPO—Mar. 5, 2024.

\* cited by examiner

*Primary Examiner* — Jason Lappas
(74) *Attorney, Agent, or Firm* — Loza & Loza, LLP

(57) ABSTRACT

Aspects of the present disclosure are directed to techniques and procedures for reducing memory (e.g., DRAM) access latency (e.g., read latency, write latency) due to memory refreshes. In some aspects, a memory refresh scheduling algorithm can take into account of memory access batching (e.g., read batch, write batch). In some aspects, a refresh scheduling algorithm can schedule more or prioritize refreshes to occur during a write batch to reduce memory read access latency because fewer refreshes are scheduled during memory read access. The techniques can be adapted to reduce write latency.

28 Claims, 14 Drawing Sheets

BATCHING AWARE TECHNIQUES FOR REFRESHING MEMORY DEVICES

TECHNICAL FIELD

The technology discussed below relates generally to memory devices, and more particularly, to techniques for refreshing memory devices such as dynamic random access memories (DRAM).

INTRODUCTION

Memory devices such as dynamic random access memories (DRAM) are widely used in computing devices, including mobile devices, to store data and various information. To maintain data integrity, DRAM cells are periodically refreshed (e.g., every 64 microseconds (ms)) to prevent data loss due to charge leakage. However, frequent refreshes can lead to performance and increased read latencies as refresh operations prevent accesses to the memory bank(s) being refreshed. As the density and speed of DRAMs increase, the impact of the refresh operations on DRAM's overall performance and power consumption becomes more significant.

BRIEF SUMMARY

The following presents a summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a form as a prelude to the more detailed description that is presented later.

One aspect of the disclosure provides an apparatus for data storage. The apparatus includes a memory device including a plurality of memory banks and a memory controller coupled to the memory device. The memory controller is configured to perform one or more read batches to the memory device, each read batch including a plurality of read commands configured to read data from the memory device. The memory controller is further configured to perform one or more write batches to the memory device, each write batch including a plurality of write commands configured to write data to the memory device. The memory controller is further configured to perform a plurality of refreshes to the plurality of memory banks within a refresh interval, a first portion of the plurality of refreshes being scheduled to occur during the one or more write batches, and a second portion of the plurality of refreshes being scheduled to occur during the one or more read batches. A ratio of an average number of refreshes included in the second portion to an average number of refreshes included in the first portion, is less than one.

One aspect of the disclosure provides an apparatus for data storage. The apparatus includes a memory device including a plurality of memory banks and a memory controller coupled to the memory device. The memory controller is configured to perform one or more read batches to the memory device, each read batch including a plurality of read commands configured to read data from the memory device. The memory controller is further configured to perform one or more write batches to the memory device, each write batch including a plurality of write commands configured to write data to the memory device. The memory controller is further configured to perform a plurality of refreshes to the plurality of memory banks within a refresh interval, a first portion of the plurality of refreshes being scheduled to occur during the one or more write batches, and a second portion of the plurality of refreshes being scheduled to occur during the one or more read batches. A ratio of an average number of refreshes included in the first portion to an average number of refreshes included in the second portion, is less than one.

One aspect of the disclosure provides a method of operating a memory device. The method includes performing one or more read batches to the memory device, each read batch including a plurality of read commands configured to read data from the memory device. The method further includes performing one or more write batches to the memory device, each write batch including a plurality of write commands configured to write data to the memory device. The method further includes performing a plurality of refreshes to a plurality of memory banks of the memory device within a refresh interval, a first portion of the plurality of refreshes being scheduled to occur during the one or more write batches, and a second portion of the plurality of refreshes being scheduled to occur during the one or more read batches. A ratio of an average number of refreshes included in the first portion to an average number of refreshes included in the second portion, is less than one.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

Figure 1:
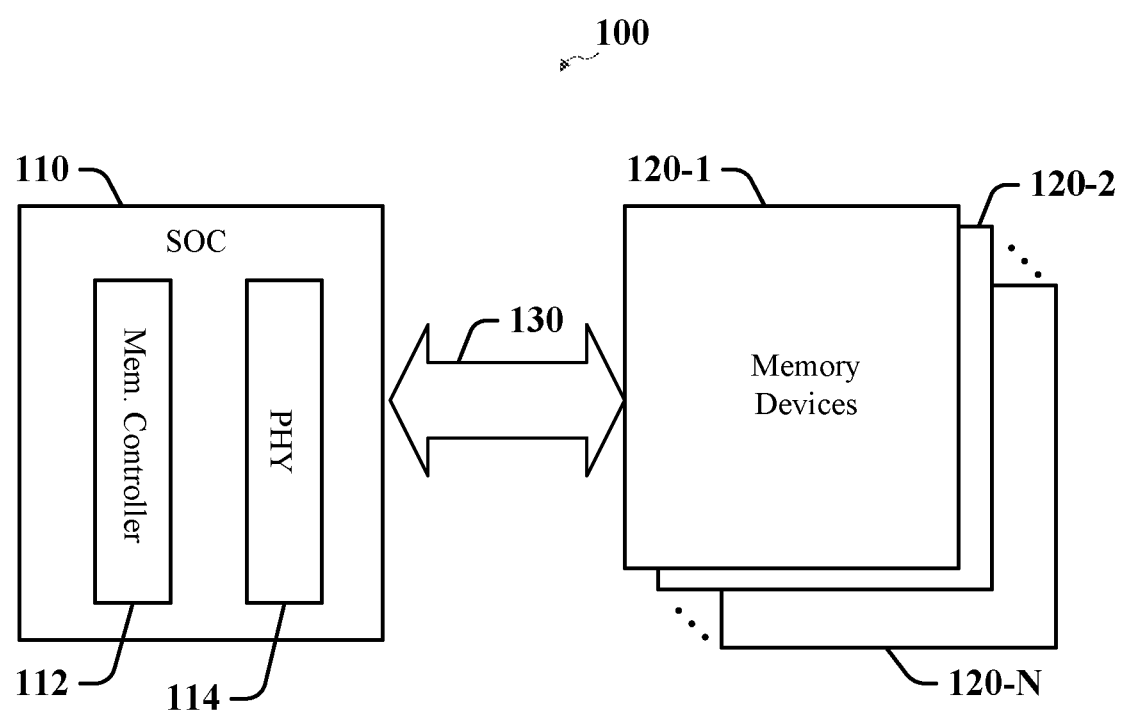
FIG. 1 is a block diagram illustrating an example of a memory system according to some aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, these concepts may be practiced without these specific details. In some instances, well-known structures and components are shown in block diagram form in order to avoid obscuring such concepts.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, processes, operations, elements, and/or components, but do not preclude the presence or addition of one or more other features, integers, processes, operations, elements, components, and/or groups thereof.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the examples described herein, the corresponding form of any such examples may be described herein as, for example, "logic configured to" perform the described action.

A dynamic random access memory (DRAM or dynamic RAM) is a type of random-access semiconductor memory that stores data in a plurality of memory cells (e.g., one bit of data per memory cell). Each memory cell typically includes an access transistor and a capacitor. In some DRAM examples, a memory cell may use two transistors with one of the transistors configured to store a charge corresponding to the data. In each DRAM cell, data is stored as an electrical charge in the capacitor. However, the charge stored in the cell's capacitor leaks over time. To retain the data in the cell, periodic refreshes of all cells are performed. However, cell refresh operations consume power and time. In mobile devices, power consumed to perform memory refreshes can be of particular concern.

FIG. 1 is a block diagram illustrating an example of a memory system 100 according to some aspects. In some aspects, the memory system 100 may be a memory subsystem of a mobile device (e.g., smartphone), network equipment, automotive device, etc. In one aspect, the memory system 100 may include a system-on-chip (SOC) 110 and a memory device 120 communicating over a data link 130. In one example, the memory device 120 may include one or more DRAM devices 120-1, 120-2, . . . , and 120-N, where N may be any integer greater than zero. In some aspects, the SOC 110 may contain processing parts, memory, communication interface (e.g., transceivers, modems), and other components. In some examples, the SOC may include a central processing unit (CPU), a graphics processing unit (GPU), an image processing unit (ISP), a digital signal processor (DSP), a neural processing unit (NPU), a video encoder/decoder, and/or one or more modems (e.g., a cellular modem, a Wi-Fi modem, and/or a Bluetooth modem).

In some aspects, the data link 130 may include a plurality of signal lines, for example, signal lines to transmit unidirectional signals (e.g., clock (CK), chip select (CS), command and address (CA), etc.) from the SOC 110 to the memory device 120 and bidirectional signals (e.g., data (DQ), data strobe (DQS), etc.). In some aspects, the SOC 110 may include a memory controller 112 and a physical layer (PHY) circuitry 114. The SOC 110 and the memory device 120 may be in communication with each other over the data link 130 and PHY circuitry 114. In some aspects, the memory controller 112 can communicate with the memory device 120 by writing data to and reading data from the memory cells of the memory device 120. In some examples, the memory controller 112 may be considered to be external to or separated from the memory device 120.

Figure 2:
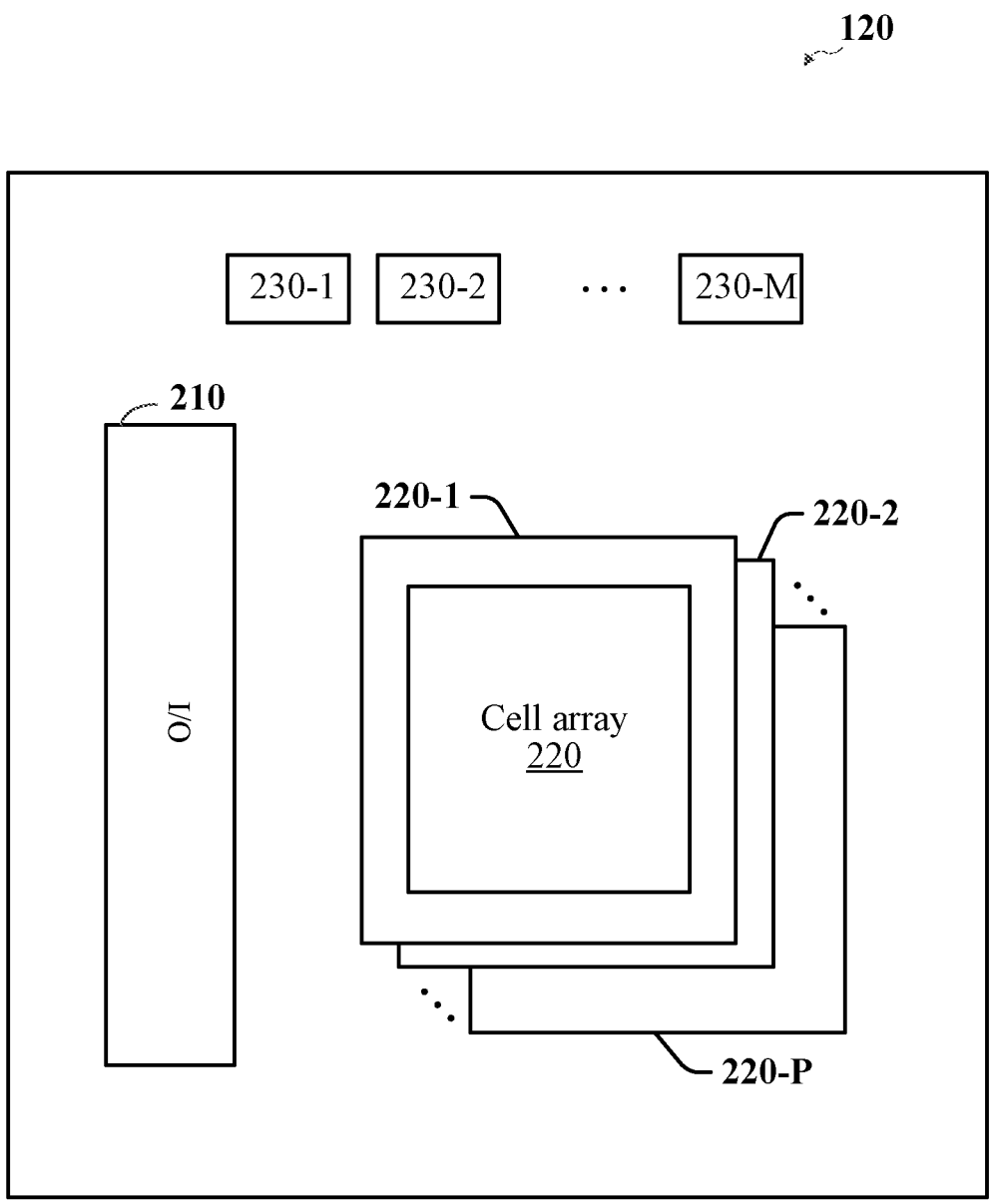
FIG. 2 is a block diagram illustrating an example of a memory device according to some aspects of the present disclosure.

An example of the memory device 120 is illustrated in FIG. 2 in more detail. The memory device 120 may be arranged as one or more ranks. In some aspects, the memory device 120 may include an input/output (I/O) circuit 210 configured to interface with the memory controller 112. In some aspects, the I/O circuit 210 may include a data buffer, one or more decoders (e.g., a row decoder and a column decoder), a sense amplifier, etc. for interfacing with the memory devices (e.g., DRAM). The I/O circuit 210 may also be configured to write data to and read data from a plurality of memory cells 220 (e.g., one or more cell arrays). In some aspects, the memory cells of the memory device 120 may be DRAM cells which store data as charges on capacitors or transistors.

In some aspects, each rank of the plurality of memory cells includes a plurality of memory banks (or simply banks). For example, the memory cells 220 may have P banks 220-1, 220-2 . . . , and 220-P per rank, where P may be any integer greater than zero. The memory cells in each bank may be further partitioned into a plurality of blocks or segments. The memory cells within a bank may be addressed in various ways, for example, by row addresses, column addresses, or a combination thereof.

In some aspects, the memory device 120 may further include one or more mode registers 230. The mode registers 230 may define or control the behavior of the memory device 120. For example, the memory device may have M mode registers 230-1, 230-2, . . . , and 230-M, where M may be any integer greater than zero. Each mode register 230 may be a write type, a read type, or a read/write type. The memory controller 112 may issue a mode register write (MRW) command to a particular mode register along with a mode value, then the I/O circuit 210 can write the mode value to the designated mode register. The memory controller 112 may also issue a mode register read (MRR) command to a particular mode register, and the I/O circuit 210 may read from the designated mode register and provide the read value to the memory controller 112. In some aspects, the mode registers 230 can control various operations of the memory device 120, for example, the refresh operations, read operations, write operations, burst read operations, burst write operations, etc.

When the memory cells of the memory device 120 are DRAM cells, periodic refreshes are performed to maintain the integrity of data stored in the cells. In some aspects, the memory device 120 may be configured to be in a self-refresh (SR) mode or in an auto-refresh (AR) mode. In one example, the memory device 120 may enter and exit the SR mode upon respectively receiving a self-refresh-enter (SRE) and a self-refresh-exit (SRX) command from the memory controller 112.

When the memory device 120 is in the SR mode, the memory device 120 (e.g., the I/O circuit 210 or some other components) can be configured to refresh the memory cells without receiving refresh (REF) commands from the memory controller 112. In this mode, the memory device 120 can generate the necessary refresh pulses through a built-in timer (not shown), and thereby negate the need for the memory controller 112 to issue explicit REF commands. The SR mode may be considered as a low power refresh mode because the SOC 110 can be in an idle state to reduce power consumption. On the other hand, when the memory device 120 is in the AR mode (or active state), the memory controller 112 can control the refresh operations through issuing the REF commands. For example, the I/O circuit 210 can refresh the memory cells upon receiving the REF command from the memory controller 112.

Figure 3:
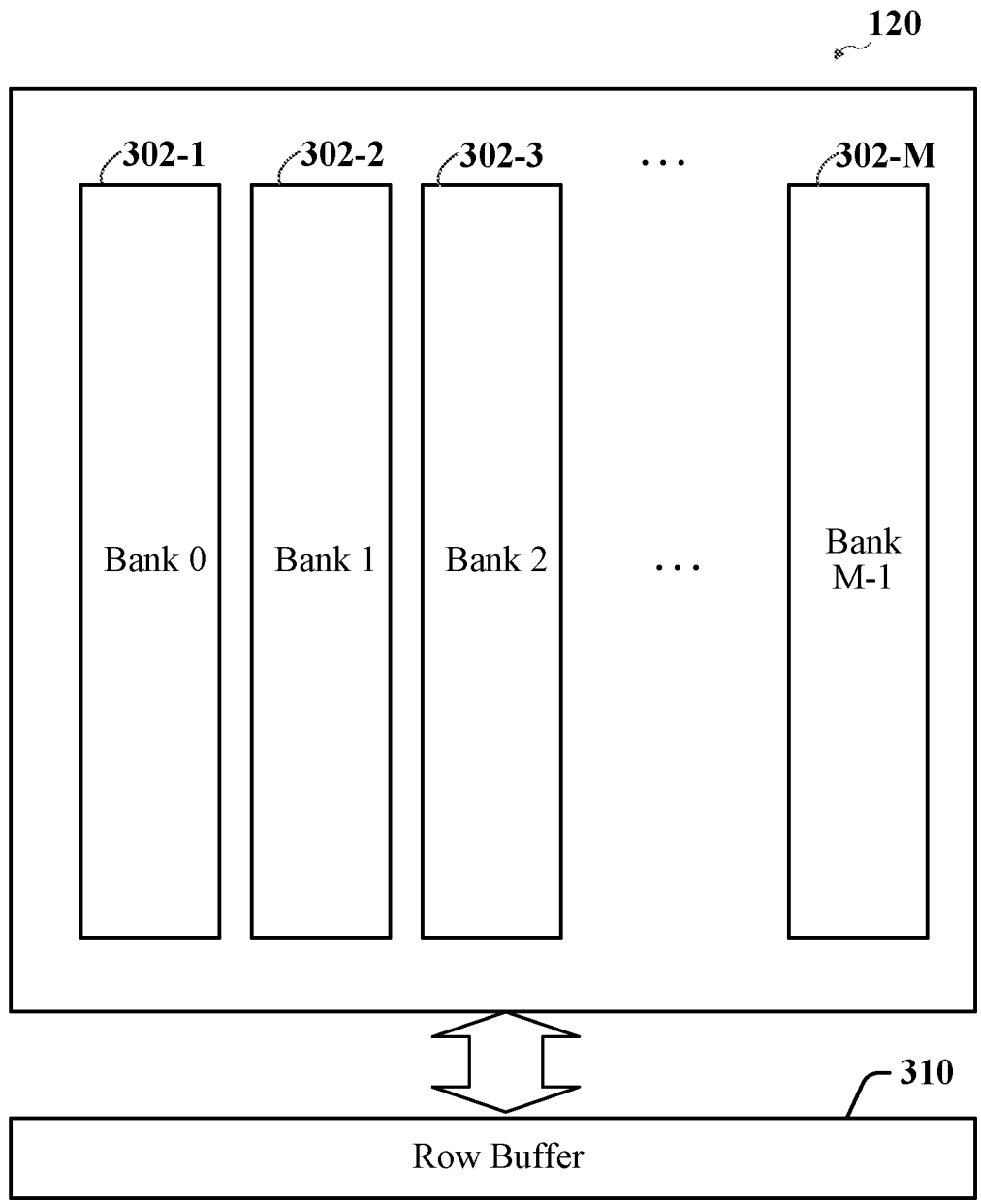
FIG. 3 is a conceptual diagram illustrating exemplary memory banks of a memory device according to some aspects of the present disclosure.

FIG. 3 is a conceptual diagram illustrating exemplary memory banks of the memory device 120. In this example, the memory cells of a rank can be partitioned into M banks (e.g., banks 302_1 to 302_M). The cells within each bank can be divided into multiple segments (e.g., 8 segments) per bank. In some examples, the memory device 120 may have 8 or 16 banks. In some aspects, read and write operations to the memory device 120 (e.g., banks) can be performed in one or more bursts (e.g., read burst, write burst). To that end, the SOC 110 can select a memory location (e.g., a memory address) and a burst length (e.g., 4 or 8 reads/writes) that can be communicated to the memory device 120 via the data link 130. In DRAM devices, read or write operations begin with an activate command (ACTIVATE), which is then followed by a read (RD) or write (WR) command. The memory address and the activate command together select the bank and row to be activated for read or write access.

In the memory device 120, a bank can include an array of memory cells. Each memory address indicates a row and column pair. When a memory location (data location) needs to be accessed, the memory device 120 transfers data of a relevant row into a row buffer 310. The data at a specific column of the row is then retrieved from the row buffer. The row buffer 310 can hold the data of one row at a time. The memory controller 112 (or I/O circuit 210) can interact with the data (e.g., read or write data) that is present in the row buffer 310. When the requested data is present in a row that is already loaded in the row buffer, the row is called an open row. In this case, the memory access (read or write) is considered a hit. If the requested data is present in a different row than the one in the row buffer, the row is called a closed row. In this case, the memory access is considered a miss or conflicted. To access data in a closed row, the existing data of an open row in the row buffer needs to be written back to the memory device. This process is called precharging. The memory controller 112 can send a precharge command (PRECHARGE) to the memory device 120 to close or deactivate the current row in the row buffer (after read or write access) and prepare the bank for the next access. Then an activate command can be issued for a new row. In response, the memory device can load the new row into the row buffer 310.

In some aspects, reading from and writing to the memory device 120 can be performed in batches (e.g., one or more read batches, one or more write batches). A read batch includes a plurality of read requests or accesses, and a write batch includes a plurality of write requests or accesses. If scheduled consecutively, all requests in a read batch or write batch can result in a row buffer hit, thus minimizing latency and maximizing memory data throughput.

While periodic refreshes of the memory cells can prevent data loss due to charge leakage, frequent refreshes can lead to performance degradation in terms of reduced bandwidth and increased read latencies because refresh operations prevent access to the memory bank(s) during refresh. Any activated bank is precharged (PRECHARGE) before a refresh command (REF) can be applied to the activated bank. In some applications, read latencies are particularly important and any latency penalty due to refreshes can be undesirable.

Some aspects of the present disclosure are directed to techniques and procedures for reducing memory (e.g., DRAM) access latency (e.g., read latency, write latency) due to memory refreshes. In some aspects, a memory refresh scheduling algorithm can take into account of memory access batching (e.g., read batch, write batch). In some aspects, a refresh scheduling algorithm can schedule more or prioritize refreshes to occur during a write batch to reduce memory read access latency because none or fewer refreshes are scheduled during memory read access. In some aspects, the algorithm schedules as many memory refreshes as possible during the write batch(es). In some aspects, the algorithm can schedule refreshes to an idle bank during the read batch. The idle bank is not accessed or used (no data traffic) during the read batch. In some aspects, the algorithm can schedule refreshes to occur during a transition between a read batch and a write batch (e.g., read-to-write batch and write-to-read batch) to hide write/read precharge time penalties.

In some aspects, the memory device 120 can be refreshed using a per-bank refresh (PBR) process and/or all-bank refresh (ABR) that refreshes all banks of the memory device 120. The PBR process refreshes the banks of the memory device 120 in sequence (e.g., using multiple REF commands sequentially for different banks). The ABR process refreshes all banks together (e.g., using a single REF command for all banks). All cells of the memory device 120 need to be refreshed within a refresh window or interval (tREFI) using PBR or ABR. In one example, eight PBRs or one ABR can be performed per tREFI (e.g., 7.8 µs) to be JEDEC compliant.

Figure 4:
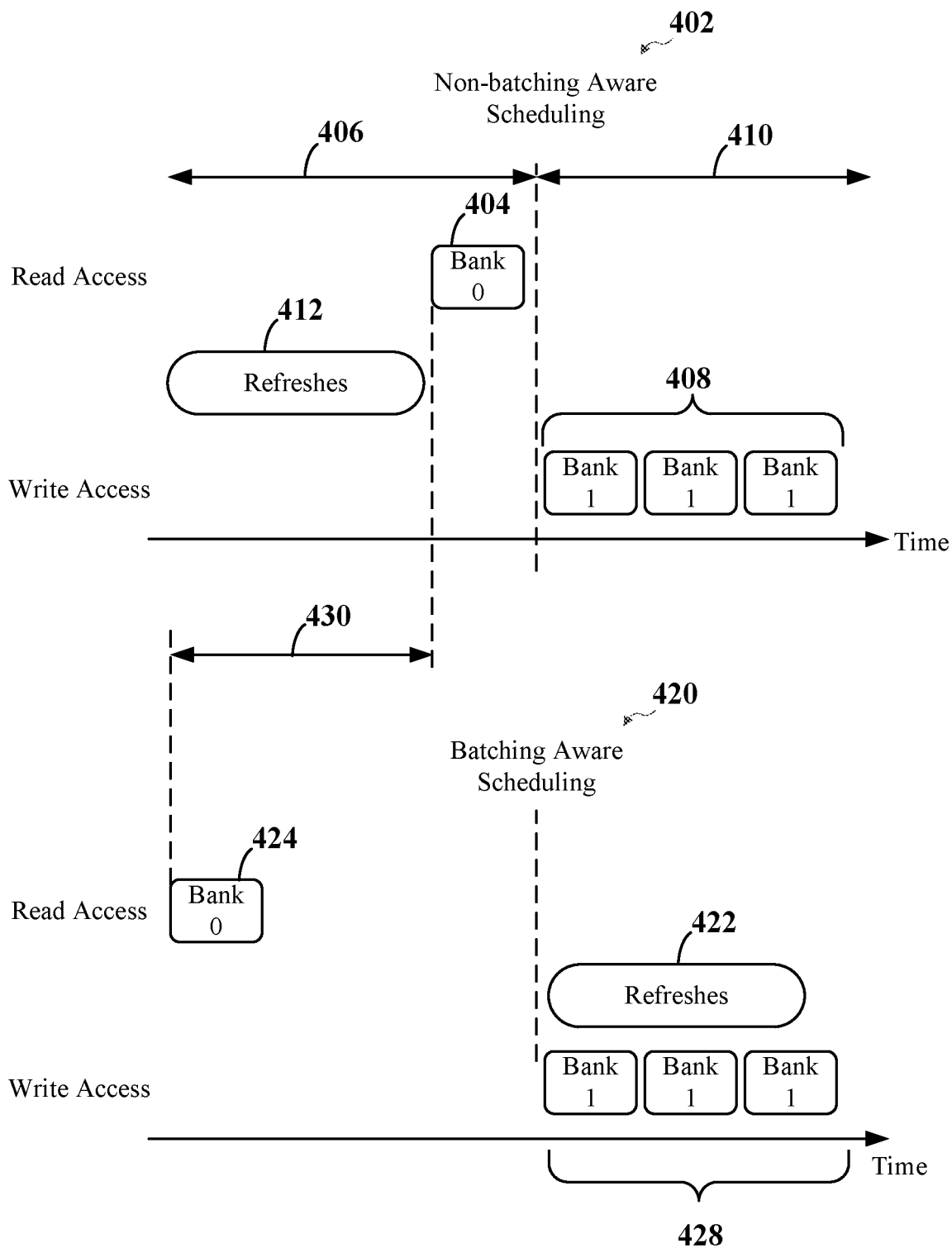
FIG. 4 is a diagram illustrating a first exemplary batching-aware memory refresh scheduling process according to some aspects of the present disclosure.

FIG. 4 is a diagram illustrating a non-batching aware refresh scheduling process and a first exemplary batching-aware refresh scheduling process of the memory device 120 according to some aspects. In a non-batching aware scheduling example 402, the memory controller 112 can schedule one or more read batches (e.g., read batch 404 to bank 0) in a first period 406 and one or more write batches (e.g., write batch 408) in a second period 410. The read batch 404 can be directed to one or more first banks, and the write batch can be directed to one or more second banks that may be the same or different from the first banks. In one example, the read batch 404 may be directed to bank 0, and the write batch 408 may be directed to bank 1.

In the first scheduling example 402, the memory controller 112 can schedule memory refreshes 412 (e.g., refresh bank 0) to occur in the first period 406 before the read batch 404 (e.g., read batch to bank 0). However, the refresh 412 can increase the latency of the read batch 404 because the memory bank is not available during the memory refreshes 412.

In a second scheduling example 420, using batching-aware scheduling, the memory controller 112 can schedule a read batch 424 in the first period 406 and one or more write batches (e.g., write batch 428) in the second period 410. In one example, the read batch 424 can be directed to bank 0, and the write batch 428 can be directed to bank 1. In one aspect, the memory controller 112, being aware of the scheduled read/write batching, can schedule as many memory refreshes (e.g., refreshes 422) as possible during the write batch 428. In one aspect, the memory controller 112 can schedule none or as few refreshes as possible during the read batch 424. In this case, the read latency 430 can be reduced or avoided. In one example, the refreshes 422 may be PBRs directed to an idle bank (e.g., bank 0) that is not used during the write batch 428, and the write batch can be directed to bank 1. In one example, the memory controller can schedule one or more ABRs before or after the write batch 428.

Figure 5:
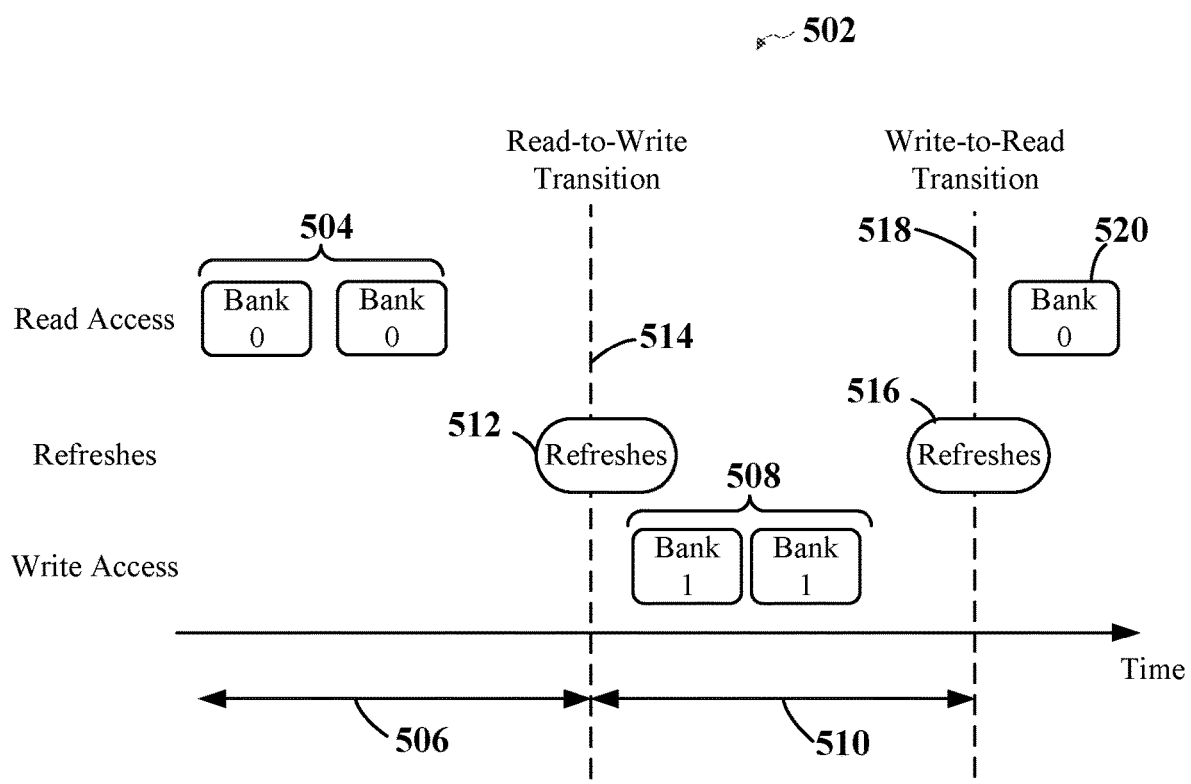
FIG. 5 is a diagram illustrating a second exemplary batching-aware memory refresh scheduling process according to some aspects of the present disclosure.

FIG. 5 is a diagram illustrating a second batching-aware refresh scheduling example 502 according to some aspects. In this example, the memory controller 112 can schedule one or more read batches (e.g., read batch 504 to bank 0) to the memory device 120 in a first period 506 and one or more write batches (e.g., write batch 508 to bank 1) in a second period 510. In this case, the memory controller 112, being aware of the read/write batching, can schedule one or more memory refreshes 512 during a read-to-write transition 514. Scheduling the refreshes during the read-to-write transition 514 can hide precharge penalties. In some aspects, the memory controller 112 can schedule memory refreshes 516 during a write-to-read transition 518 between the write batches 508 and the following read batch 520. Scheduling the refreshes during the write-to-read transition 518 can hide precharge penalties.

In some aspects, the batching-aware algorithm described herein can avoid scheduling memory refreshes (e.g., PBR) for memory banks used during a read batch or a write batch, and schedule PBR to idle bank(s). Thus, the read latency will be approximately the same as if no refreshes were scheduled.

Figure 6:
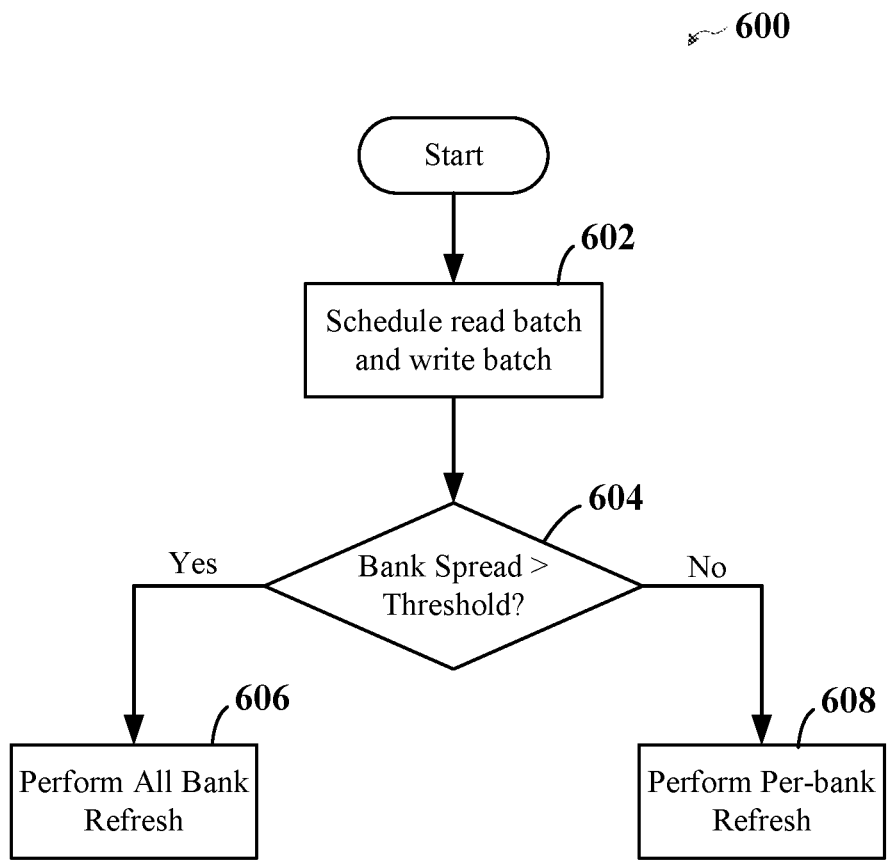
FIG. 6 is a flow diagram of an algorithm for scheduling memory refreshes according to aspects of the present disclosure.

FIG. 6 illustrates a flow diagram of an exemplary algorithm 600 for scheduling memory refreshes according to some aspects of the disclosure. In certain aspects, the algorithm 600 can schedule memory refreshes of the memory device 120 (e.g., DRAM with 1× or 4× refresh rates) based on a bank spread of a read batch or write batch.

At block 602, the memory controller 112 can schedule one or more read batches (e.g. read batch 424) and one or more write batches (e.g., write batches 428) to the memory device 120. As described above, the memory device 120 can have a plurality of banks (e.g., 8 or 16 banks). In some aspects, the read batch can include a plurality of consecutive read commands directed to one or more banks of the memory device 120.

At decision block 604, the memory controller 112 can determine whether or not the bank spread of the read batch is greater than a threshold. Bank spread refers to the number of banks accessed for a certain read batch. For example, when the read batch includes read commands directed to X banks (X is a positive integer), the bank spread is equal to X. In one example, the threshold may be equal to 8 banks or 14 banks. In some aspects, the threshold can be a static threshold (e.g., a predetermined threshold) or a dynamic threshold. The memory controller can change the dynamic threshold, for example, 8 banks or 14 banks.

At block 606, when the bank spread is greater than the bank spread threshold (e.g., 8 banks or 14 banks), the memory controller 112 can schedule back-to-back all-bank refresh (ABRs) commands during the write batch period, for example, at 4× refresh rate. Otherwise, at block 608, when the bank spread is not greater than the threshold, the memory controller 112 can send one or more per-bank refreshes (PBRs) during the read batch for the idle banks and additional PBRs during the write batches for the banks not yet refreshed in the current refresh interval (tREFI) with priority to the idle banks. The idle bank is a bank that is not accessed during the read or write batch.

In some aspects, the number of refreshes that can be scheduled during a read or write batch period can be determined based on the time interval (tpbr2pbr) between two consecutive PBRs to different banks and the average read/write batch duration. For example, the maximum number of per bank refreshes scheduled in a read/write batch can be determined as:

$$\text{Number of per bank refreshes} \cong \frac{\text{Average Read/Write Batch Time}}{tpbr2pbr} \quad (1)$$

Figure 7:
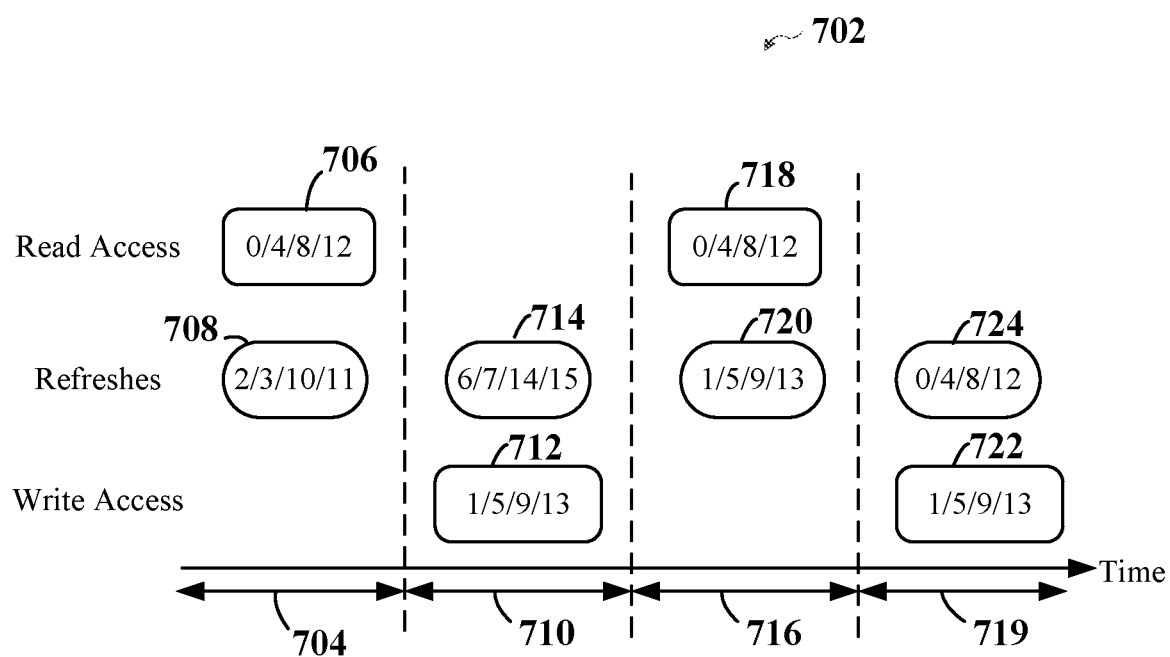
FIG. 7 is a diagram illustrating a third exemplary batching-aware memory refresh scheduling process according to some aspects of the present disclosure.

FIG. 7 is a diagram illustrating a third batching-aware refresh scheduling example 702 of the memory device 120 according to some aspects. The memory controller 112 can schedule one or more read batches and one or more write batches. In one example, the memory device 120 may have 16 banks (bank 0 to bank 15). The memory controller 112 can use equation (1) above to determine the number of PBRs that can be performed during a read/write batch.

In this example, the memory controller 112 can schedule alternate read batches (e.g., banks 0, 4, 8, and 12) and write batches (e.g., banks 1, 5, 9, 13). It is assumed that all read and write transactions result in hits and are 64 bytes in length. In this case, the average read batch time may be about 164 nanoseconds (ns), and the tpbr2pbr time may be about 90 ns. Therefore, the number of refreshes that can be scheduled during the read batch is 2 to 3 according to equation (1). In some examples, banks in an LPDDR5 (Low-Power Double Data Rate 5) DRAM are refreshed in pairs per JEDEC requirement. In some examples, banks in an LPDDR4 DRAM need not be refreshed in pairs. When two banks are refreshed as a pair, it takes the same amount of time for a PBR of one bank. In this case, the average write batch time may be about 186 ns, and the tpbr2pbr time may be about 90 ns. Therefore, the number of refreshes that can be scheduled during the write batch is 2 to 3 according to equation (1).

In another example, all read and write transactions result in conflicts and are 64 bytes in length. In this example, the average read batch time may be about 117 ns, and the tpbr2pbr time may be about 90 ns. Therefore, the number of refreshes that can be scheduled during the read batch is 2 according to equation (1). The average write batch time may be about 147 ns, and the tpbr2pbr time may be about 90 ns. In this case, the number of refreshes that can be scheduled during the write batch is two according to equation (1).

In a first period 704, when the read batch 706 includes traffic to banks 0, 4, 8, and 12, the memory controller can perform PBR 708 for banks 2, 3, 10, and 11 during the first read batch 706. Banks 2 and 10 can be refreshed as a pair, and banks 3 and 11 can be refreshed as a pair. In a second period 710, when the write batch 712 includes traffic to banks 1, 5, 9, and 13, the memory controller can perform PBR 714 for banks 6, 7, 14, and 15. Banks 6 and 14 can be refreshed as a pair, and banks 7 and 15 can be refreshed as a pair. In a third period 716, when the read batch 718 includes traffic to banks 0, 4, 8, and 12, the memory controller can perform PBR 720 for banks 1, 5, 9, and 13. Banks 1 and 9 can be refreshed as a pair, and banks 5 and 13 can be refreshed as a pair. In a fourth period 719, when the write batch 722 includes traffic to banks 1, 5, 9, and 13, the memory controller can perform PBR 724 for banks 0, 4, 8, and 12. Banks 0 and 8 can be refreshed as a pair, and banks 4 and 12 can be refreshed as a pair. This scheduling can optimize (e.g., maximize) possible latency (e.g., read latency) saving for such a read/write batch pattern.

Figure 8:
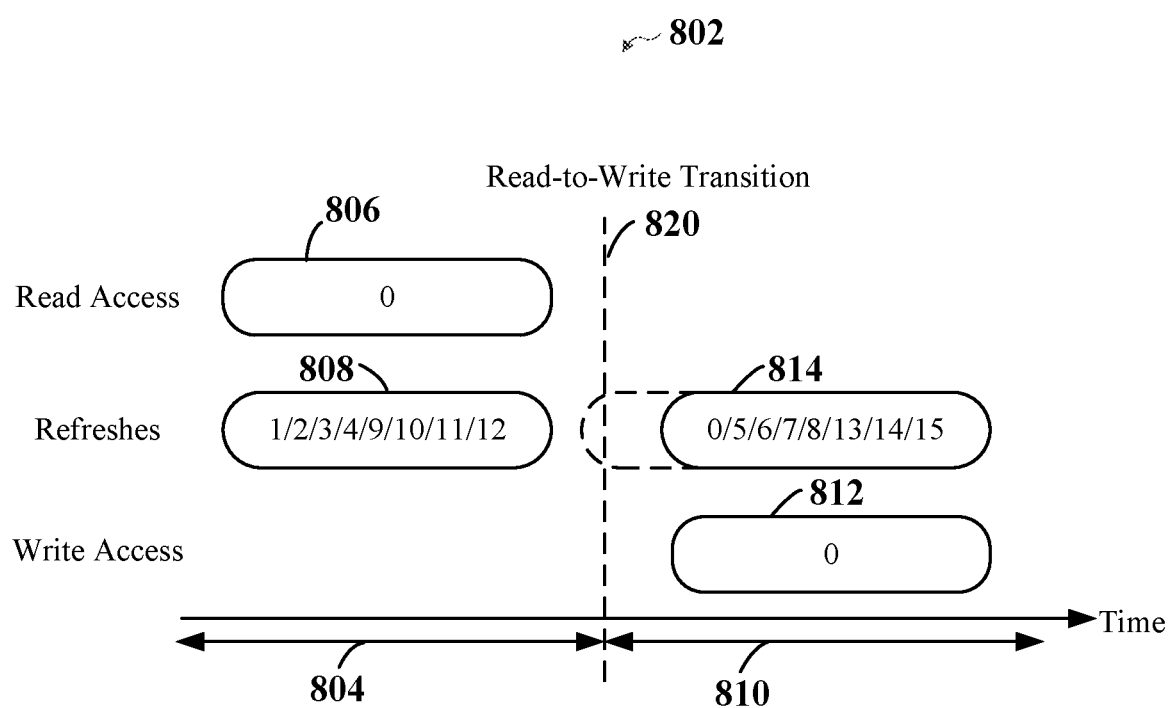
FIG. 8 is a diagram illustrating a fourth exemplary batching-aware memory refresh scheduling process according to some aspects of the present disclosure.

FIG. 8 is a diagram illustrating a fourth batching-aware refresh scheduling example 802 of the memory device 120 according to some aspects. The memory controller 112 can schedule one or more read batches and one or more write batches to the memory device 120. In one aspect, the memory controller 112 can schedule alternate read and write batches of the same bank (e.g., bank 0). It is assumed that all read and write transactions result in hits and are 64 bytes in length. In this example, the average read batch time may be about 342 ns, and the tpbr2pbr time may be about 90 ns. Therefore, the number of refreshes that can be scheduled during the read batch is 3 to 4 according to equation (1). In this example, the average write batch time may be about 344 ns, and the tpbr2pbr time may be about 90 ns. Therefore, the number of refreshes that can be scheduled during the write batch is 3 to 4 according to equation (1).

In this example, the memory device 120 may have 16 banks (bank 0 to bank 15). In a first period 804, when the read batch 806 includes bank 0, the memory controller can perform PBR 808 for banks 1, 2, 3, 4, 9, 10, 11, and 12 during the first read batch 806. Banks (1, 9), (2, 10), (3, 11), and (4, 12) can be refreshed as pairs. In a second period 810, when the write batch 812 includes bank 0, the memory controller can perform PBR 814 for banks 0, 5, 6, 7, 8, 13, 14, and 15. Banks (0, 8), (5, 13), (6, 14), and (7, 15) can be refreshed as pairs. In the example of FIG. 8, the algorithm schedules no refresh to the active bank (e.g., bank 0) during the read batch. Instead, the algorithm schedules the refresh of bank 0, which is accessed during the read batch, to occur during the read-to-write batch transition 820 or at the start of the write batch 812. This scheduling can optimize (e.g., maximize) possible latency (e.g., read latency) saving for such a read/write batch pattern.

Figure 9:
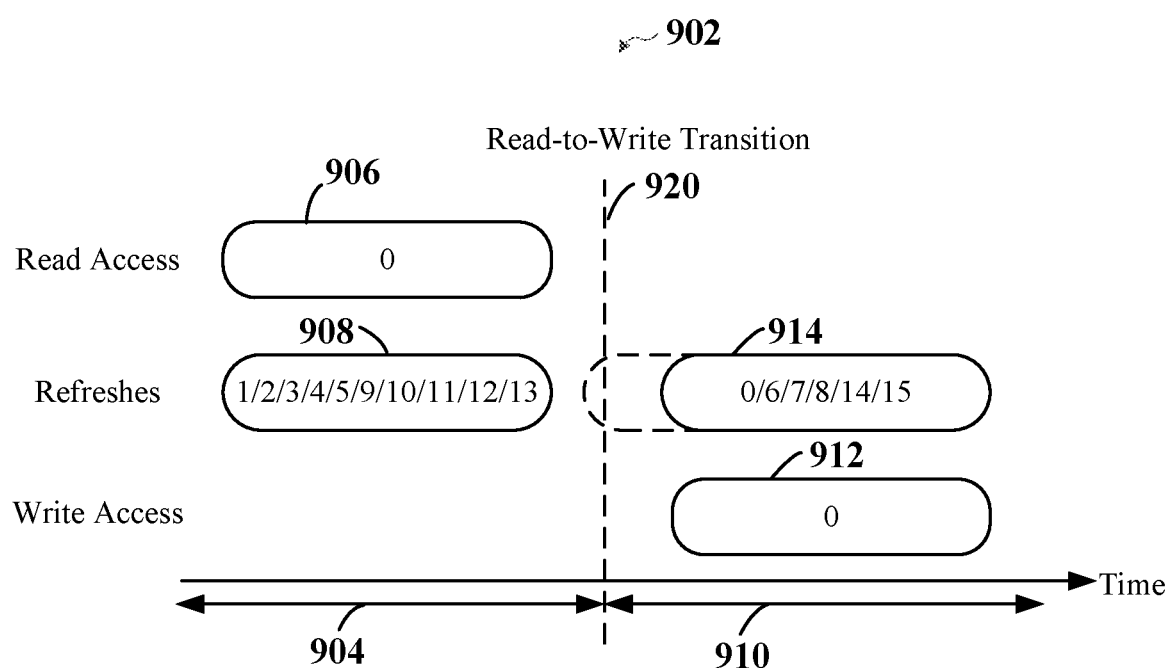
FIG. 9 is a diagram illustrating a fifth exemplary batching-aware memory refresh scheduling process according to some aspects of the present disclosure.

FIG. 9 is a diagram illustrating a fifth batching-aware refresh scheduling example 902 according to some aspects. The memory controller 112 can schedule one or more read batches and one or more write batches to the memory device 120. In one aspect, the memory controller 112 can schedule alternate read and write batches of the same bank (e.g., bank 0). In one aspect, the memory device 120 may have 16 banks (bank 0 to bank 15). In this example, all read and write transactions result in conflicts and are 64 bytes in length. The average read batch time may be about 670 ns, and the tpbr2pbr time may be about 90 ns. Therefore, 5 or 6 refreshes can be scheduled during the read batch according to equation (1). The average write batch time may be about 943 ns, and the tpbr2pbr time may be about 90 ns. Therefore, 10 or 11 refreshes can be scheduled during the write batch according to equation (1).

In a first period 904, when the read batch 906 includes bank 0, the memory controller can perform PBR 908 for banks 1, 2, 3, 4, 5, 9, 10, 11, 12, and 13 during the first read batch 906. In some aspects, banks (1, 9), (2, 10), (3, 11), (4, 12), and (5, 13) can be refreshed as pairs. In a second period 910, when the write batch 912 includes bank 0, the memory controller can perform PBR 914 for banks 0, 6, 7, 8, 14, and 15. In some aspects, banks (0, 8), (6, 14), and (7, 15) can be refreshed as pairs. In the example of FIG. 9, the algorithm schedules no refresh to the bank (e.g., bank 0) used during the read batch. Instead, the algorithm schedules the refresh of bank 0 that is accessed during the read batch to occur during the read-to-write batch transition 920 or at the start of the write batch 912. This scheduling can optimize (e.g., maximize) possible latency reduction for the read/write batch.

Figure 10:
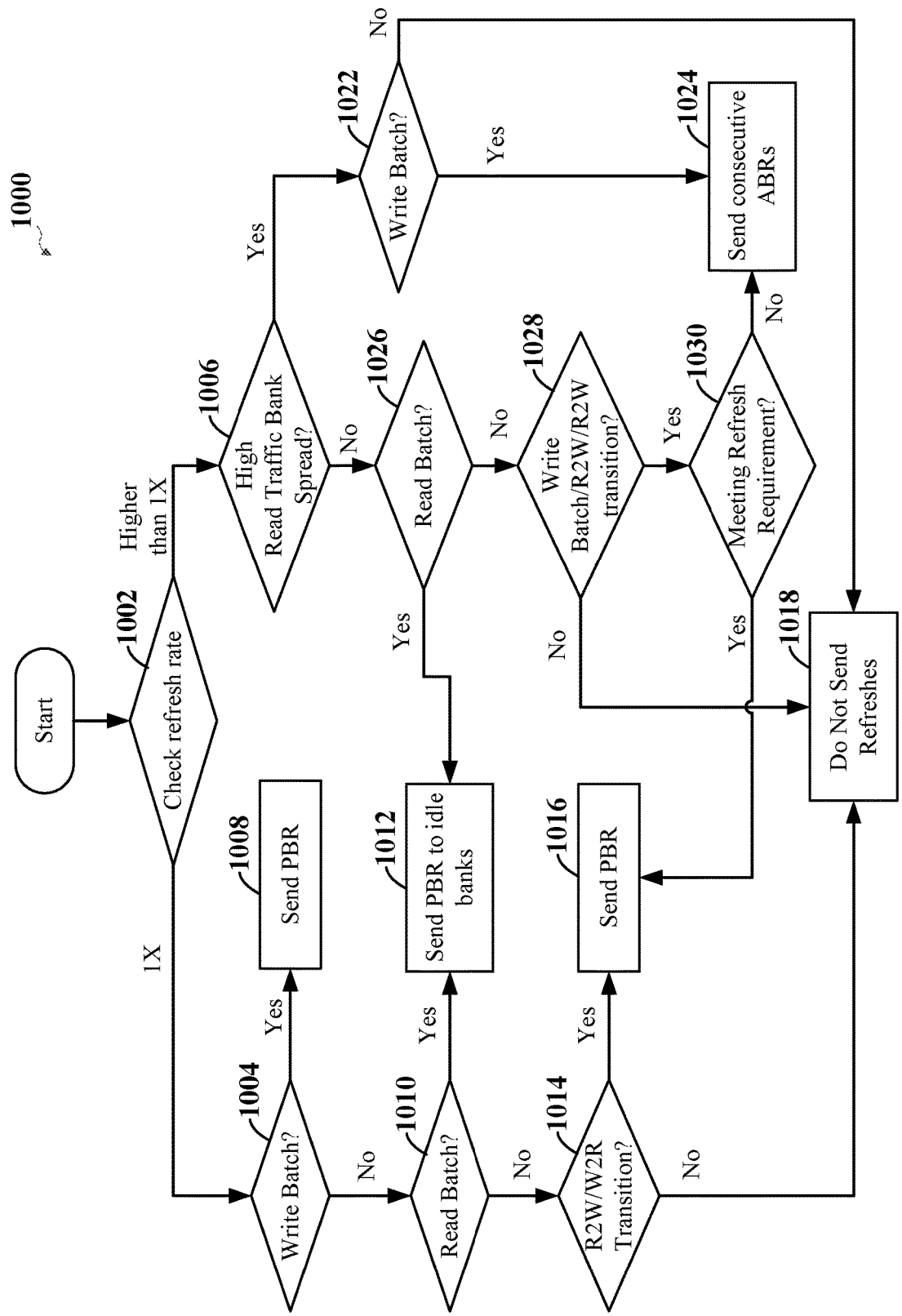
FIG. 10 illustrates a flow diagram of a memory refresh scheduling algorithm according to some aspects of the present disclosure.

FIG. 10 illustrates a flow diagram of a memory refresh scheduling algorithm 1000 according to some aspects of the disclosure. In certain aspects, the algorithm 1000 can be used by the memory controller 112 to schedule memory refreshes of the memory device 120. In one example, the memory device 120 may be a DRAM device. In other aspects, the algorithm 1000 may be adapted to suit other memory devices. In some aspects, the memory device 120 may include a plurality of memory banks (e.g., banks 302 of FIG. 3).

At 1002, the algorithm can determine the refresh rate of the memory device. In some aspects, the memory device can be refreshed at 1× mode, 2× mode, 4× mode, or higher. In 1× mode, the memory device may have a refresh interval of 7.8 microseconds (µs) per JEDEC requirements or tREFI. In 2× mode, the memory device is refreshed twice more frequently than 1× mode. Similarly, in 4× mode, the memory device is refreshed four times more frequently than 1× mode. When the refresh rate is 1×, the algorithm proceeds to block 1004; otherwise, when the refresh rate is higher than 1× (e.g., 4× or higher), the algorithm proceeds to block 1006.

At 1004, the algorithm can determine whether the current memory access is a write batch or not. At 1008, when the current memory access is a write batch, the algorithm can send PBR commands to the memory device. At 1010, the algorithm can determine whether the current memory access is a read batch or not. At 1012, when the current memory access is a read batch, the algorithm can send PBR commands to any idle bank(s) during the read batch.

At 1014, the algorithm can determine whether the current memory access is a transition between a read batch and a write batch (e.g., a read-to-write (R2W) transition or write-to-read (W2R) transition) or not. At 1016, when the current memory access is in a read-to-write transition, the algorithm can send PBR commands to the memory device. At 1018, when the algorithm further determines that the current memory access is not in a read-to-write transition, the algorithm does not send memory refresh commands to the memory device.

At 1006, for higher refresh rates (e.g., 4× or higher), the algorithm can determine whether the read traffic has a bank spread that is higher than a threshold (e.g., greater than 14) or not. In one example, the memory device may have 16 banks (banks 0 to 15) with PBR performed in pairs (e.g., banks 0/8, 1/9, 2/10, 3/11, 4/12, 5/13, 6/14, and 7/15). In this case, when the read traffic has a bank spread higher than 14, the memory controller cannot schedule any PBR during the read batch because there is no idle bank in the read batch. At 1022, when the read traffic has a high bank spread, the algorithm further determines whether the current memory access belongs to a write batch or not. Then, at 1024, when the current memory access is a write batch, the algorithm can send consecutive ABR commands to the memory device. Otherwise, when the current memory access is not a write batch, the algorithm does not send refresh commands to the memory device (at 1018).

At 1026, when the read traffic does not have a high bank spread (e.g., higher than 8 or 14), the algorithm further determines whether the current memory access belongs to a read batch or not. If the memory access is a read batch, then the algorithm can send PBR to the idle banks. At 1028, when the current memory access is not a read batch, the algorithm further determines whether the current memory access is a write batch or in a transition (e.g., R2W or W2R transition) between read and write batches. When the current memory access is a write batch or in a transition between read and write batches, the algorithm proceeds to block 1030; otherwise, the algorithm proceeds to block 1018 where the algorithm does not send refresh commands to the memory device.

At 1030, the algorithm further determines whether the memory device can meet its refresh requirements (e.g., 8 PBRs per JEDEC tREFI). When the memory device can meet its refresh requirement, the algorithm can send PBR commands (at 1016) to the memory device. Otherwise, when the memory device cannot meet its refresh requirement, the algorithm can send consecutive ABR commands to the memory device (at 1024).

Figure 11:
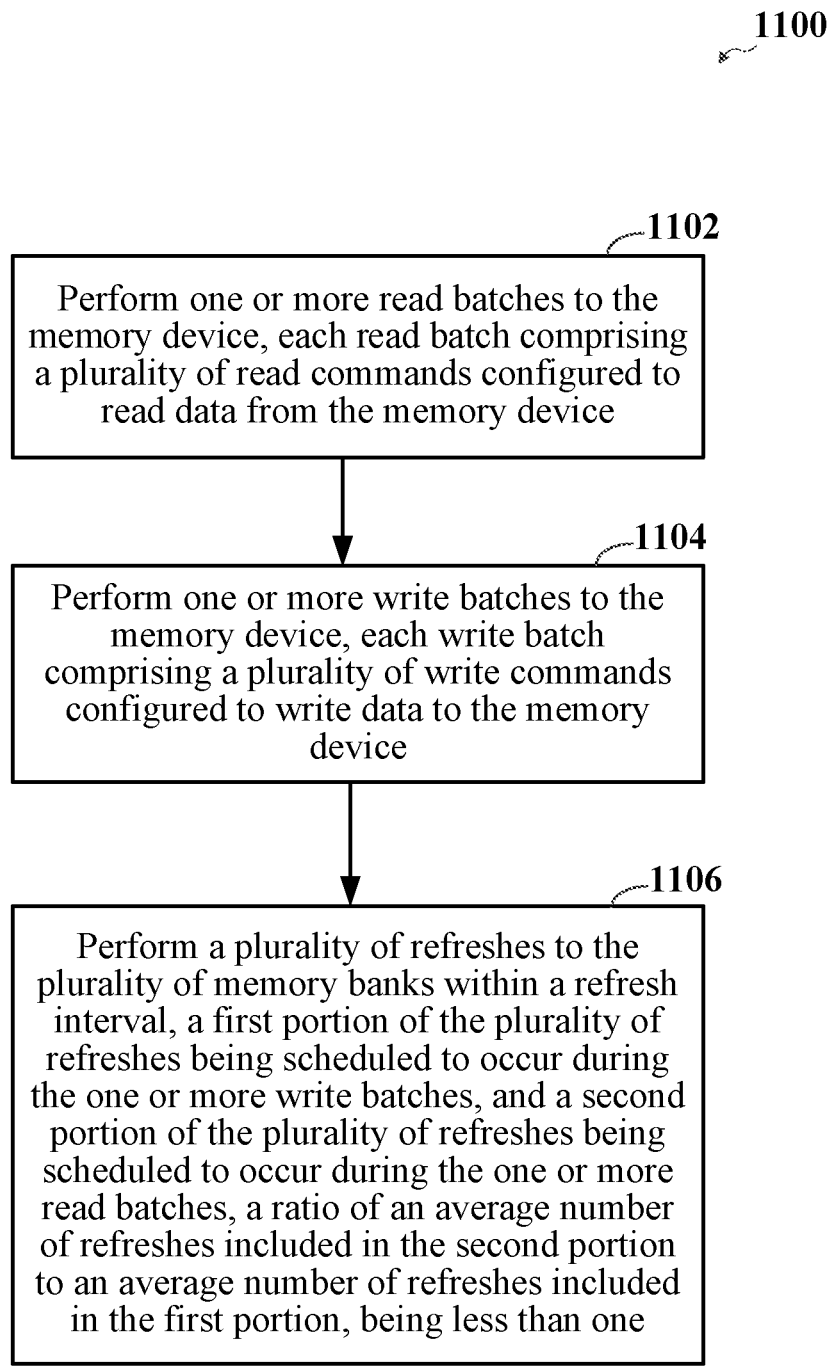
FIG. 11 is a flow diagram of a method for performing memory refreshes to a memory device according to aspects of the present disclosure.

FIG. 11 illustrates a flow diagram of a method 1100 for performing memory refreshes to a memory device according to aspects of the present disclosure. In one example, the method 1100 can be performed using the memory controller 112. In certain aspects, the method 1100 provides techniques for performing memory refreshes of the memory device 120. In one example, the memory device 120 may be a DRAM device. In other aspects, the method may be adapted to suit other memory devices. In some aspects, the memory device 120 may include a plurality of memory banks (e.g., banks 302 of FIG. 3).

At 1102, the method includes a process of performing one or more read batches to the memory device. Each read batch includes a plurality of read commands configured to read data from the memory device. In one example, the memory controller 112 can provide a means to perform the one or more read batches, for example, similar to those read batches described above in relation to FIGS. 4-9. The read batches can read data from one or more banks of the memory device.

At 1104, the method includes a process of performing one or more write batches to the memory device. Each write batch includes a plurality of write commands configured to write data to the memory device. In one example, the memory controller 112 can provide a means to perform the one or more write batches, for example, similar to those write batches described above in relation to FIGS. 4-9. The write batches can write data to one or more banks of the memory device.

In some aspects, the method can reduce latency (e.g., read latency) due to refreshes by using a refresh scheduling algorithm that is read-write batching aware. In one aspect, the algorithm can schedule as many refreshes as possible during the write batch while scheduling refreshes to idle bank(s) during the read batch. In one aspect, the algorithm can schedule refreshes during a read-to-write batch transition to hide precharge penalties. In one aspect, the algorithm can schedule refreshes during a write-to-read batch transition to hide precharge penalties.

At 1106, the method includes a process of performing a plurality of refreshes to the plurality of memory banks within a refresh interval. In one example, the refresh interval may be a time limit (e.g., maximum duration) between memory refreshes (e.g., JEDEC tREFI). A first portion of the plurality of refreshes is scheduled to occur during the one or more write batches, and a second portion of the plurality of refreshes is scheduled to occur during the one or more read batches. In some aspects, a ratio of the average number of refreshes included in the second portion to the average number of refreshes included in the first portion can be less than one (i.e., between 0 and <1). For example, the memory controller can determine the average number of refreshes during the read batches and write batches over a number of refresh intervals (e.g., two or more tREFIs). In this example, because the memory controller prioritizes scheduling the refreshes during the write batches, there can be no refreshes during some read batches. Therefore, the ratio of the average number of refreshes during the read batches to the average number of refreshes during the write batches for multiple tREFIs (e.g., 8 tREFI) can be less than one. In some aspects, the second portion includes fewer refreshes than the first portion. In some aspects, the memory controller can schedule as many refreshes as possible during the write batches so that none or fewer refreshes are scheduled during the read batches. The above-described techniques for scheduling refreshes can reduce read latency.

It is also contemplated that the above-described scheduling techniques can be adapted to reduce write latency. For example, the memory controller can schedule as many refreshes as possible during the read batch so that none or fewer refreshes are scheduled during the write batch. In this case, a ratio of the average number of refreshes (e.g., PBR) scheduled during the write batch to the average number of refreshes scheduled during the read batch can be less than one (i.e., between 0 and <1).

Figure 12:
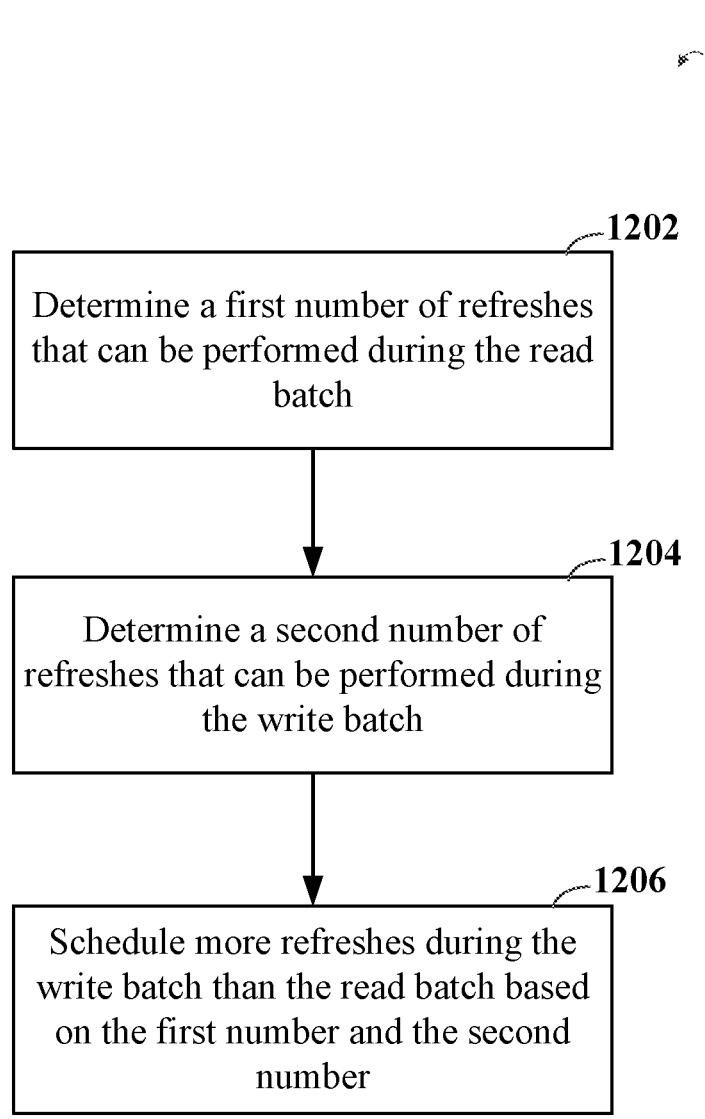
FIG. 12 illustrates a flow diagram of a method for scheduling memory refreshes during a read batch and a write bath according to aspects of the present disclosure.

FIG. 12 illustrates a flow diagram of a method 1200 for scheduling memory refreshes according to aspects of the present disclosure. In certain aspects, the method 1200 provides techniques for scheduling memory refreshes of the memory device 120. In other aspects, the method may be adapted to suit other memory devices. In some aspects, the memory controller 112 can use the method 1200 to schedule the memory refreshes used at block 1106 of the method 1100 described above.

At block 1202, the memory controller 112 can determine a first number of refreshes that can be performed during a read batch. For example, the memory controller 112 can determine the first number of refreshes using equation (1). The first number indicates the maximum of refreshes that can be performed during the read batch.

At block 1204, the memory controller 112 can determine a second number of refreshes that can be performed during a write batch. For example, the memory controller 112 can determine the second number of refreshes using equation (1). The second number indicates the maximum of refreshes that can be performed during the write batch.

At block 1206, the memory controller 112 can schedule more refreshes during the write batch than the read batch based on the first number and the second number. For example, the memory controller 112 can schedule a number of refreshes during the write batch up to (no greater than) the second number determined at block 1204. In some examples, the memory controller 112 can schedule no refreshes during the read batch, and schedule all the necessary refreshes during the write batch.

Figure 13:
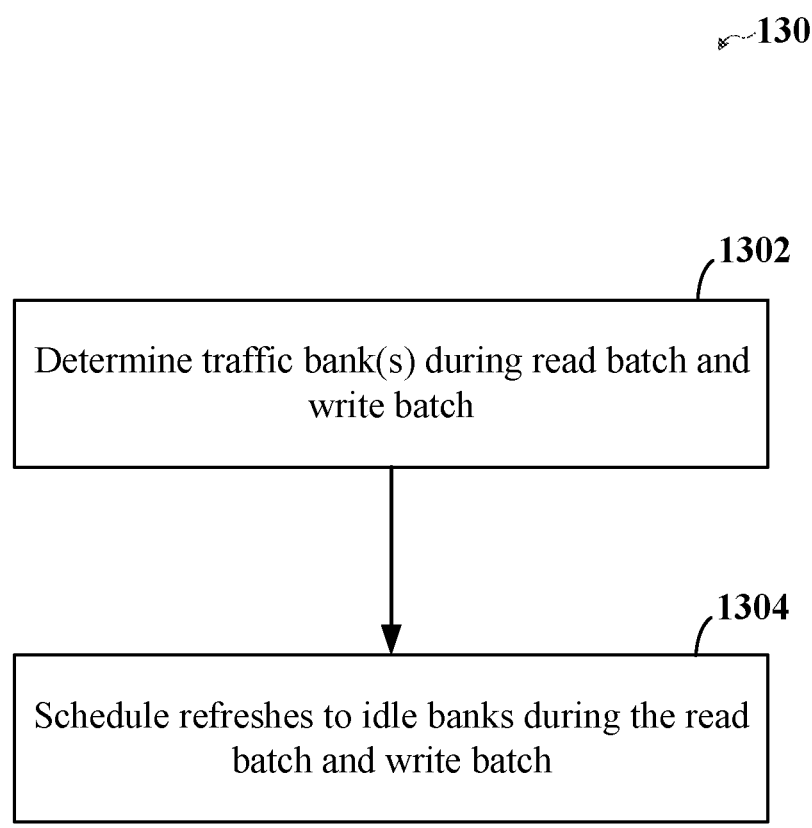
FIG. 13 illustrates a flow diagram of a method for scheduling memory refreshes to idle banks according to aspects of the present disclosure.

FIG. 13 illustrates a flow diagram of a method 1300 for scheduling memory refreshes according to aspects of the present disclosure. In certain aspects, the method 1300 provides techniques for scheduling memory refreshes of the memory device 120. In other aspects, the method may be adapted to suit other memory devices. In some aspects, the memory controller 112 can use the method 1300 to schedule the memory refreshes used at block 1106 of the method 1100 described above.

At block 1302, the memory controller 112 can determine the traffic bank(s) during the read batch and write batch. A traffic bank is accessed (e.g., read or write access) during a read batch or a write batch. For example, the traffic banks may be the traffic banks described above in relation to FIGS. 4, 5, and 7-9.

At block 1304, the memory controller 112 can schedule memory refreshes to idle banks during the read batch and write batch. The idle banks are not accessed during the read batch and write batch. The method avoids scheduling the refreshes to traffic banks during the read batch and write batch. In this case, the read/write latency will not be significantly affected by the refreshes.

In one aspect, the method can schedule the plurality of refreshes as one or more per-bank refreshes to one or more idle banks of the plurality of memory banks. In one aspect, the method can schedule a refresh of the plurality of refreshes to occur during a transition time period between the one or more read batches and the one or more write batches. In one aspect, the method can perform a refresh of the memory device that overlaps the transition time period. In one aspect, the transition time period corresponds to a transition from the one or more read batches to the one or more write batches. In one aspect, the transition time period corresponds to a transition from the one or more write batches to the one or more read batches. In one aspect, the method can perform a plurality of back-to-back all bank refreshes when a bank spread of the one or more read batches is greater than a predetermined number (e.g., >8). In one aspect, when a bank spread of the one or more read batches is smaller than a predetermined number, the method can schedule a first portion of the plurality of refreshes as a plurality of per-bank refreshes (PBRs) during the one or more read batches; and schedule a second portion of the plurality of refreshes as a plurality PBRs during the one or more write batches. In one aspect, the method can schedule a first number of refreshes included in the first portion of the plurality of refreshes based on an average read batch time and a time interval between two per-bank refreshes to different banks of the plurality of memory banks; and schedule a second number of refreshes included in the second portion of the plurality of refreshes based on an average write batch time and the time interval between two per-bank refreshes. In one aspect, the method can perform the plurality of refreshes within a refresh interval limit (tREFI) of the memory device.

Figure 14:
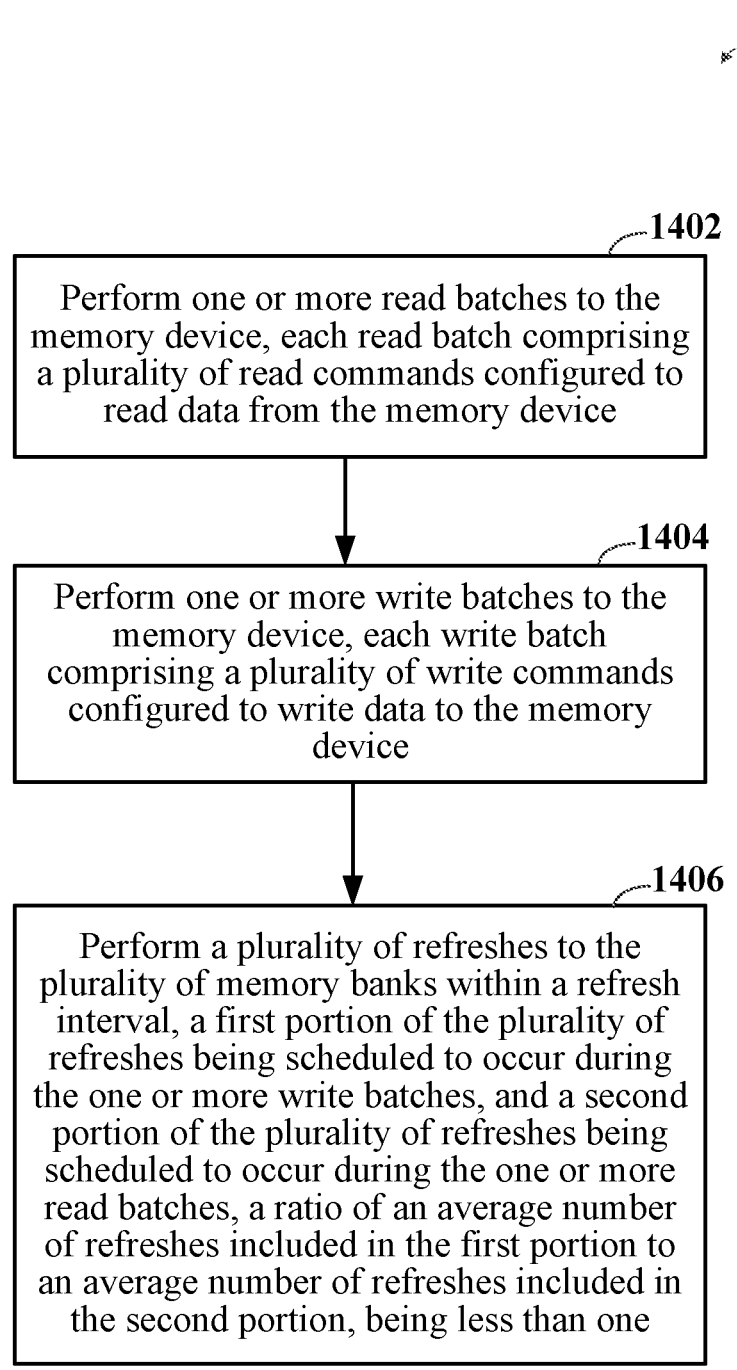
FIG. 14 is a flow diagram of a method for performing memory refreshes to a memory device according to aspects of the present disclosure.

FIG. 14 illustrates a flow diagram of a method 1400 for performing memory refreshes to a memory device according to aspects of the present disclosure. In one example, the method 1400 can be performed using the memory controller 112. In certain aspects, the method 1400 provides techniques for performing memory refreshes of the memory device 120. In one example, the memory device 120 may be a DRAM device. In other aspects, the method may be adapted to suit other memory devices. In some aspects, the memory device 120 may include a plurality of memory banks (e.g., banks 302 of FIG. 3).

At 1402, the method includes a process of performing one or more read batches to the memory device. Each read batch includes a plurality of read commands configured to read data from the memory device. In one example, the memory controller 112 can provide a means to perform the one or more read batches, for example, similar to those read batches described above in relation to FIGS. 4-9. The read batches can read data from one or more banks of the memory device.

At 1404, the method includes a process of performing one or more write batches to the memory device. Each write batch includes a plurality of write commands configured to write data to the memory device. In one example, the memory controller 112 can provide a means to perform the one or more write batches, for example, similar to those write batches described above in relation to FIGS. 4-9. The write batches can write data to one or more banks of the memory device.

In some aspects, the method can reduce latency (e.g., write latency) due to refreshes by using a refresh scheduling algorithm that is read-write batching aware. In one aspect, the algorithm can schedule as many refreshes as possible during the read batch while scheduling refreshes to idle bank(s) during the write batch. In one aspect, the algorithm can schedule refreshes during a read-to-write batch or write-to-read transition to hide precharge penalties.

At 1406, the method includes a process of performing a plurality of refreshes to the plurality of memory banks within a refresh interval. In one example, the refresh interval may be a time limit (e.g., maximum duration) between memory refreshes (e.g., JEDEC tREFI). A first portion of the plurality of refreshes is scheduled to occur during the one or more write batches, and a second portion of the plurality of refreshes is scheduled to occur during the one or more read batches. In some aspects, a ratio of the average number of refreshes included in the first portion to the average number of refreshes included in the second portion can be less than one (i.e., between 0 and <1). For example, the memory controller can determine the average number of refreshes during the read batches and write batches over a number of refresh intervals (e.g., two or more tREFIs). In this example, because the memory controller prioritizes scheduling the refreshes during the read batches, there can be no refreshes during some write batches. In some aspects, the first portion includes fewer refreshes than the second portion. In some aspects, the memory controller can schedule as many refreshes as possible during the read batches so that none or fewer refreshes are scheduled during the write batches. The above-described techniques for scheduling refreshes can reduce write latency.

The following provides an overview of examples of the present disclosure.

A first aspect of the disclosure provides an apparatus for data storage. The apparatus comprises: a memory device comprising a plurality of memory banks; and a memory controller coupled to the memory device, the memory controller being configured to: perform one or more read batches to the memory device, each read batch comprising a plurality of read commands configured to read data from the memory device; perform one or more write batches to the memory device, each write batch comprising a plurality of write commands configured to write data to the memory device; and perform a plurality of refreshes to the plurality of memory banks within a refresh interval, a first portion of the plurality of refreshes being scheduled to occur during the one or more write batches, and a second portion of the plurality of refreshes being scheduled to occur during the one or more read batches, a ratio of an average number of refreshes included in the second portion to an average number of refreshes included in the first portion, being less than one.

In a second aspect, alone or in combination with the first aspect, wherein the second portion of the plurality of refreshes comprises fewer refreshes than the first portion.

In a third aspect, alone or in combination with the first aspect, wherein the second portion of the plurality of refreshes comprises no refreshes.

In a fourth aspect, alone or in combination with any of the first to third aspects, wherein the memory controller is further configured to perform the plurality of refreshes as one or more per-bank refreshes or an all-bank refresh to one or more banks of the plurality of memory banks.

In a fifth aspect, alone or in combination with any of the first to third aspects, wherein the memory controller is further configured to perform a refresh of the plurality of refreshes during a transition time period between a read batch and a write batch.

In a sixth aspect, alone or in combination with the fifth aspect, wherein the transition time period corresponds to a transition from the read batch to the write batch.

In a seventh aspect, alone or in combination with the fifth aspect, wherein the transition time period corresponds to a transition from the write batch to the read batch.

In an eighth aspect, alone or in combination with any of the first to third aspects, wherein the memory controller is further configured to perform a plurality of back-to-back all bank refreshes during the one or more write batches when a bank spread of the one or more read batches is greater than a threshold.

In a ninth aspect, alone or in combination with any of the first to third aspects, wherein the memory controller is further configured to, when a bank spread of the one or more read batches is smaller than a threshold: perform a first portion of the plurality of refreshes as a first plurality of per-bank refreshes (PBRs) directed to one or more idle banks of the plurality of memory banks during the one or more read batches; and perform a second portion of the plurality of refreshes as a second plurality of PBRs during the one or more write batches, the second plurality of PBRs being directed to one or more banks of the plurality of memory banks that are not refreshed by the first plurality of PBRs.

In a tenth aspect, alone or in combination with the ninth aspect, wherein the memory controller is further configured to prioritize the second plurality of PBRs to one or more idle banks during the one or more write batches.

In an eleventh aspect, alone or in combination with any of the first to third aspects, wherein the memory controller is further configured to: schedule a first number of per-bank refresh (PBR) included in the first portion of the plurality of refreshes based on an average read batch time and a time interval between two per-bank refreshes to different banks of the plurality of memory banks; and schedule a second number of PBR included in the second portion of the plurality of refreshes based on an average write batch time and the time interval between two per-bank refreshes.

In a twelfth aspect, alone or in combination with any of the first to third aspects, wherein the memory controller is further configured to perform the plurality of refreshes within a refresh interval limit of the memory device.

A thirteenth aspect of the disclosure provides a method of operating a memory device. The method comprises: performing one or more read batches to the memory device, each read batch comprising a plurality of read commands configured to read data from the memory device; performing one or more write batches to the memory device, each write batch comprising a plurality of write commands configured to write data to the memory device; and performing a plurality of refreshes to a plurality of memory banks of the memory device within a refresh interval, a first portion of the plurality of refreshes being scheduled to occur during the one or more write batches, and a second portion of the plurality of refreshes being scheduled to occur during the one or more read batches, a ratio of an average number of refreshes included in the second portion to an average number of refreshes included in the first portion, being less than one.

In a fourteenth aspect, alone or in combination with the thirteenth aspect, wherein the second portion of the plurality of refreshes comprises fewer refreshes than the first portion.

In a fifteenth aspect, alone or in combination with the thirteenth aspect, wherein the second portion of the plurality of refreshes comprises no refreshes.

In a sixteenth aspect, alone or in combination with any of the thirteenth to fifteenth aspects, the method further comprises: performing the plurality of refreshes as one or more per-bank refreshes or an all-bank refresh to one or more banks of the plurality of memory banks.

In a seventeenth aspect, alone or in combination with any of the thirteenth to fifteenth aspects, the method further comprises: performing a refresh of the plurality of refreshes during a transition time period between a read batch and a write batch.

In an eighteenth aspect, alone or in combination with the seventeenth aspect, wherein the transition time period corresponds to a transition from the read batch to the write batch.

In a nineteenth aspect, alone or in combination with the seventeenth aspect, wherein the transition time period corresponds to a transition from the write batch to the read batch.

In a twentieth aspect, alone or in combination with any of the thirteenth to fifteenth aspects, the method further comprises: performing a plurality of back-to-back all bank refreshes during the one or more write batches when a bank spread of the one or more read batches is greater than a threshold.

In a twenty-first aspect, alone or in combination with any of the thirteenth to fifteenth aspects, the method further comprises, when a bank spread of the one or more read batches is smaller than a threshold: performing a first portion of the plurality of refreshes as a first plurality of per-bank refreshes (PBRs) directed to one or more idle banks of the plurality of memory banks during the one or more read batches; and performing a second portion of the plurality of refreshes as a second plurality of PBRs during the one or more write batches, the second plurality of PBRs being directed to one or more banks of the plurality of memory banks that are not refreshed by the first plurality of PBRs.

In a twenty-second aspect, alone or in combination with the twenty-first aspect, the method further comprises: prioritizing the second plurality of PBRs to one or more idle banks during the one or more write batches.

In a twenty-third aspect, alone or in combination with any of the thirteenth to fifteenth aspects, the method further comprises: scheduling a first number of per-bank refresh (PBR) included in the first portion of the plurality of refreshes based on an average read batch time and a time interval between two per-bank refreshes to different banks of the plurality of memory banks; and scheduling a second number of PBRs included in the second portion of the plurality of refreshes based on an average write batch time and the time interval between two per-bank refreshes.

In a twenty-fourth aspect, alone or in combination with any of the thirteenth to fifteenth aspects, the method further comprises: performing the plurality of refreshes within a refresh interval limit of the memory device.

A twenty-fifth aspect of the disclosure provides an apparatus for data storage. The apparatus comprises: a memory device comprising a plurality of memory banks; and a memory controller coupled to the memory device, the memory controller being configured to: perform one or more read batches to the memory device, each read batch comprising a plurality of read commands configured to read data from the memory device; perform one or more write batches to the memory device, each write batch comprising a plurality of write commands configured to write data to the memory device; and perform a plurality of refreshes to the plurality of memory banks within a refresh interval, a first portion of the plurality of refreshes being scheduled to occur during the one or more write batches, and a second portion of the plurality of refreshes being scheduled to occur during the one or more read batches, a ratio of an average number of refreshes included in the first portion to an average number of refreshes included in the second portion, being less than one.

In a twenty-sixth aspect, alone or in combination with the twenty-fifth aspect, wherein the first portion of the plurality of refreshes comprises fewer refreshes than the second portion.

A twenty-seventh aspect of the disclosure provides a method of operating a memory device. The method comprises: performing one or more read batches to the memory device, each read batch comprising a plurality of read commands configured to read data from the memory device; performing one or more write batches to the memory device, each write batch comprising a plurality of write commands configured to write data to the memory device; and performing a plurality of refreshes to a plurality of memory banks of the memory device within a refresh interval, a first portion of the plurality of refreshes being scheduled to occur during the one or more write batches, and a second portion of the plurality of refreshes being scheduled to occur during the one or more read batches, a ratio of an average number of refreshes included in the first portion to an average number of refreshes included in the second portion, being less than one.

In a twenty-eighth aspect, alone or in combination with the twenty-seventh aspect, wherein the first portion of the plurality of refreshes comprises fewer refreshes than the second portion.

It is to be appreciated that the present disclosure is not limited to the exemplary terms used above to describe aspects of the present disclosure. For example, bandwidth may also be referred to as throughput, data rate or another term.

Any reference to an element herein using a designation e.g., "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect electrical or other communicative coupling between two structures. Also, the term "approximately" means within ten percent of the stated value.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus for data storage, comprising:
a memory device comprising a plurality of memory banks; and
a memory controller coupled to the memory device, the memory controller being configured to:
perform one or more read batches to the memory device, each read batch comprising a plurality of read commands configured to read data from the memory device;
perform one or more write batches to the memory device, each write batch comprising a plurality of write commands configured to write data to the memory device; and
perform a plurality of refreshes to the plurality of memory banks within a refresh interval, a first portion of the plurality of refreshes being scheduled to occur during the one or more write batches, and a second portion of the plurality of refreshes being scheduled to occur during the one or more read batches, a ratio of an average number of refreshes included in the second portion to an average number of refreshes included in the first portion, being less than one.

2. The apparatus of claim 1, wherein the second portion of the plurality of refreshes comprises fewer refreshes than the first portion.

3. The apparatus of claim 1, wherein the second portion of the plurality of refreshes comprises no refreshes.

4. The apparatus of claim 1, wherein the memory controller is further configured to:
perform the plurality of refreshes as one or more per-bank refreshes or an all-bank refresh to one or more banks of the plurality of memory banks.

5. The apparatus of claim 1, wherein the memory controller is further configured to:
perform a refresh of the plurality of refreshes during a transition time period between a read batch and a write batch.

6. The apparatus of claim 5, wherein the transition time period corresponds to a transition from the read batch to the write batch.

7. The apparatus of claim 5, wherein the transition time period corresponds to a transition from the write batch to the read batch.

8. The apparatus of claim 1, wherein the memory controller is further configured to:
perform a plurality of back-to-back all bank refreshes during the one or more write batches when a bank spread of the one or more read batches is greater than a threshold.

9. The apparatus of claim 1, wherein the memory controller is further configured to, when a bank spread of the one or more read batches is smaller than a threshold:
perform a first portion of the plurality of refreshes as a first plurality of per-bank refreshes (PBRs) directed to one or more idle banks of the plurality of memory banks during the one or more read batches; and
perform a second portion of the plurality of refreshes as a second plurality of PBRs during the one or more write batches, the second plurality of PBRs being directed to one or more banks of the plurality of memory banks that are not refreshed by the first plurality of PBRs.

10. The apparatus of claim 9, wherein the memory controller is further configured to prioritize the second plurality of PBRs to one or more idle banks during the one or more write batches.

11. The apparatus of claim 1, wherein the memory controller is further configured to:
schedule a first number of per-bank refresh (PBR) included in the first portion of the plurality of refreshes based on an average read batch time and a time interval between two per-bank refreshes to different banks of the plurality of memory banks; and
schedule a second number of PBR included in the second portion of the plurality of refreshes based on an average write batch time and the time interval between two per-bank refreshes.

12. The apparatus of claim 1, wherein the memory controller is further configured to:
perform the plurality of refreshes within a refresh interval limit of the memory device.

13. A method of operating a memory device, comprising:
performing one or more read batches to the memory device, each read batch comprising a plurality of read commands configured to read data from the memory device;
performing one or more write batches to the memory device, each write batch comprising a plurality of write commands configured to write data to the memory device; and
performing a plurality of refreshes to a plurality of memory banks of the memory device within a refresh interval, a first portion of the plurality of refreshes being scheduled to occur during the one or more write batches, and a second portion of the plurality of refreshes being scheduled to occur during the one or more read batches, a ratio of an average number of refreshes included in the second portion to an average number of refreshes included in the first portion, being less than one.

14. The method of claim 13, wherein the second portion of the plurality of refreshes comprises fewer refreshes than the first portion.

15. The method of claim 13, wherein the second portion of the plurality of refreshes comprises no refreshes.

16. The method of claim 13, further comprising:
performing the plurality of refreshes as one or more per-bank refreshes or an all-bank refresh to one or more banks of the plurality of memory banks.

17. The method of claim 13, further comprising:
performing a refresh of the plurality of refreshes during a transition time period between a read batch and a write batch.

18. The method of claim 17, wherein the transition time period corresponds to a transition from the read batch to the write batch.

19. The method of claim 17, wherein the transition time period corresponds to a transition from the write batch to the read batch.

20. The method of claim 13, further comprising:
performing a plurality of back-to-back all bank refreshes during the one or more write batches when a bank spread of the one or more read batches is greater than a threshold.

21. The method of claim 13, further comprising, when a bank spread of the one or more read batches is smaller than a threshold:
performing a first portion of the plurality of refreshes as a first plurality of per-bank refreshes (PBRs) directed to one or more idle banks of the plurality of memory banks during the one or more read batches; and
performing a second portion of the plurality of refreshes as a second plurality of PBRs during the one or more write batches, the second plurality of PBRs being directed to one or more banks of the plurality of memory banks that are not refreshed by the first plurality of PBRs.

22. The method of claim 21, further comprising:
prioritizing the second plurality of PBRs to one or more idle banks during the one or more write batches.

23. The method of claim 13, further comprising:
scheduling a first number of per-bank refresh (PBR) included in the first portion of the plurality of refreshes based on an average read batch time and a time interval between two per-bank refreshes to different banks of the plurality of memory banks; and scheduling a second number of PBRs included in the second portion of the plurality of refreshes based on an average write batch time and the time interval between two per-bank refreshes.

24. The method of claim 13, further comprising:

performing the plurality of refreshes within a refresh interval limit of the memory device.

25. An apparatus for data storage, comprising:

a memory device comprising a plurality of memory banks; and a memory controller coupled to the memory device, the memory controller being configured to:

perform one or more read batches to the memory device, each read batch comprising a plurality of read commands configured to read data from the memory device;

perform one or more write batches to the memory device, each write batch comprising a plurality of write commands configured to write data to the memory device; and perform a plurality of refreshes to the plurality of memory banks within a refresh interval, a first portion of the plurality of refreshes being scheduled to occur during the one or more write batches, and a second portion of the plurality of refreshes being scheduled to occur during the one or more read batches, a ratio of an average number of refreshes included in the first portion to an average number of refreshes included in the second portion, being less than one.

26. The apparatus of claim 25, wherein the first portion of the plurality of refreshes comprises fewer refreshes than the second portion.

27. A method of operating a memory device, comprising:

performing one or more read batches to the memory device, each read batch comprising a plurality of read commands configured to read data from the memory device;

performing one or more write batches to the memory device, each write batch comprising a plurality of write commands configured to write data to the memory device; and performing a plurality of refreshes to a plurality of memory banks of the memory device within a refresh interval, a first portion of the plurality of refreshes being scheduled to occur during the one or more write batches, and a second portion of the plurality of refreshes being scheduled to occur during the one or more read batches, a ratio of an average number of refreshes included in the first portion to an average number of refreshes included in the second portion, being less than one.

28. The method of claim 27, wherein the first portion of the plurality of refreshes comprises fewer refreshes than the second portion.

* * * * *